United States Patent
Yu et al.

(10) Patent No.: US 6,175,598 B1
(45) Date of Patent: Jan. 16, 2001

(54) OUTPUT NOISE CONTROL SCHEME FOR MULTIPLE I/O'S

(75) Inventors: James C. Yu, San Jose; Chih-Liang Chen, Saratoga, both of CA (US)

(73) Assignee: Eon Silicon Devices, Inc., Santa Clara, CA (US)

( * ) Notice: Under 35 U.S.C. 154(b), the term of this patent shall be extended for 0 days.

(21) Appl. No.: 09/032,888

(22) Filed: Mar. 2, 1998

(51) Int. Cl.$^7$ ............................................. H03K 19/0175
(52) U.S. Cl. ........................ 375/257; 326/27; 326/87; 327/108
(58) Field of Search ............................ 375/219, 220, 375/257, 377; 326/26, 27, 57, 58, 81, 87; 327/108

(56) References Cited

U.S. PATENT DOCUMENTS

| | | | |
|---|---|---|---|
| 5,319,252 | * 6/1994 | Pierce et al. | 327/170 |
| 5,332,932 | * 7/1994 | Runaldue | 326/33 |
| 5,489,861 | * 2/1996 | Seymour | 327/108 |
| 5,604,453 | * 2/1997 | Pedersen | 327/112 |
| 5,896,043 | * 4/1999 | Kumagai | 326/68 |
| 5,966,026 | * 10/1999 | Partovi et al. | 326/27 |

* cited by examiner

*Primary Examiner*—Young T. Tse
(74) *Attorney, Agent, or Firm*—Davis Chin

(57) ABSTRACT

An output noise control circuit with significantly reduced power/ground bounce characteristics when multiple outputs thereof are being simultaneously switched is provided. The output noise control circuit includes a plurality of output buffers each being formed of an output driver stage, a first pre-driver stage, and a second pre-driver stage. Each of the output driver stages includes a pull-up drive transistor and a pull-down drive transistor. Each of the first pre-driver stages includes a first inverter, and each of said second pre-driver stages includes a second inverter. A shared pull-up resistor has its one end coupled to each of the first pre-driver stage inverters and its other end connected to a ground potential node. A shared pull-down resistor has its one end coupled to each of the second pre-driver stage inverters and its other end connected to a power supply potential node. The output noise control circuit is formed with a reduced number of circuit components than the traditional output buffer circuits currently available.

18 Claims, 4 Drawing Sheets

OUTPUT NOISE CONTROL SCHEME FOR MULTIPLE I/O'S

BACKGROUND OF THE INVENTION

This invention relates generally to output buffer circuits with reduced noise characteristics. More particularly, the present invention relates to output buffer circuits which have a significant reduction in power or ground bounce noise when multiple outputs are being simultaneously switched.

As is generally well-known in the art, output buffer circuits or drivers are commonly used in digital logic circuits in order to cause an output signal to make rapid transitions between a low voltage representing a "0" logic state and a higher voltage representing a "1" logic state and vice-versa. Typically, the output buffer circuit implemented in complementary metal-oxide-semiconductor (CMOS) process technology includes a P-channel pull-up transistor device and an N-channel pull-down transistor device connected in series between respective first and second power supply terminals. The drains of the pull-up and pull-down transistor devices are connected together, which is connected to an output node to provide the output signal. The gates of the pull-up and pull-down transistor devices are connected to internal nodes adapted to receive respective control signals.

The pull-up and pull-down transistor devices are usually quite large in size since they must usually output a large drive current which may be necessary to meet the input requirements of another circuit that uses the output signal from the output buffer circuit. It is always desirable to have faster switching speeds and noise suppression in high-speed digital circuits, especially when the digital circuits are formed on the same substrate of a semiconductor integrated circuit chip with a high density of components. However, as the switching speed is increased by increasing the current drive capability of the output buffer circuit, parasitic inductances associated with the interconnection of the output node to an output terminal pin and with the connection of the transistor sources to power supply terminal pins will cause greater noise to be generated. This increased noise can interfere with the functioning of the circuit components which interface with the output buffer circuit. Thus, the trends toward higher packing density of components on a semiconductor integrated circuit chip make noise reduction or suppression especially important in output buffer circuit designs.

One form of unwanted noise generated by an output buffer circuit is referred to as "ground bounce" which is a voltage ground fluctuation induced by the switching of its output node from the higher voltage level to the low voltage level. During this high-to-low transition, a transient ground current is generated which causes oscillations or inductive ringing to appear at the output node. In particular, the magnitude of the ground bounce is larger when the voltage switching range increases or when the output current of the buffer circuit is larger. Since a ground line is shared by many devices on the integrated circuit chip, the ground bounce, if it is sufficiently large, may degrade the output voltage level (logic "1" or logic "0") causing interface problems among the output buffer circuit and other integrated circuits. A similar phenomenon referred to as "power or supply bounce" occurs when the output node is making a low-to-high transition.

Further, as the technology for manufacturing such semiconductor integrated circuit devices has advanced the number of parallel bits of information processed by such devices has increased as well. For example, in the microcomputer field a typical integrated circuit memory device may have multiple outputs consisting of 8, 16, 32 or even 64 parallel bits. As a result, with the increased number of parallel bits being outputted by such devices the number of output buffer circuits is correspondingly increased, thereby increasing the total noise generated during transitions. It should be noted that the ground or power bounce problem is even further magnified when a plurality of output buffer circuits have their outputs being simultaneously switched. In other words, for instance when eight output nodes are being switched from high-to-low at the same time, the total voltage change on the common ground line may be equal to 8 times the voltage fluctuation as when only one output node is being switched.

Various approaches have been made heretofore in the prior art of output buffer design so as to solve the problem of undesired power/ground bounce noise without sacrificing the needed high-speed of operation. One technique of the prior art for controlling output noise is depicted in FIG. 1, which illustrates a simplified schematic circuit diagram of a conventional output buffer circuit 10a formed as a portion of a semiconductor integrated circuit chip 11. The output buffer circuit 10a is comprised of an output driver stage 12, a first pre-driver stage 14, and a second pre-driver stage 16. The output driver stage 12 is formed of a P-channel MOS pull-up drive transistor 18 and an N-channel MOS pull-down drive transistor 20 coupled in series between respective first and second power supply pads 22, 24.

The first power supply pad 22 may be supplied with a positive voltage or potential VDD which is coupled to an internal power supply node VL1 via a lead line having parasitic inductance L1. The source of the drive transistor 18 is also connected to the node VL1. The parasitic inductance L1 represents a package inductance associated with the pad 22 itself and the wiring used to connect the source of the drive transistor 18 to the pad 22. The second power supply pad 24 may be supplied with a ground potential VSS which is coupled to an internal ground potential node VL2 via a lead line having parasitic inductance L2. Similarly, the parasitic inductance L2 represents a package inductance associated with the pad 24 itself and the wiring used to connect the source of the drive transistor 20 to the pad 24.

The drains of the drive transistors 18 and 20 are connected together and further joined to an internal node 26. The internal node 26 is also connected to an output pad 28 via a lead connection having parasitic inductance L3. The parasitic inductance L3 represents a package inductance associated with the output pad 28 itself and the wiring used to connect the drains of the transistors 18, 20 to the pad 28. An output signal $OUT_i$ is provided at the output pad 28 of the buffer circuit 10a and is used to drive a capacitive load CL connected between the pad 28 and the ground potential VSS. It should be understood that the output buffer circuit 10a is but for one bit only and that typical semiconductor integrated circuit devices such as memory devices having multiple outputs (e.g., 8 bits) would require a corresponding number of buffer circuits.

Further, the first pre-driver stage 14 includes an inverter 30 having its input connected to receive an input drive signal $DSO_i$ and its output connected to the gate of the drive transistor 18. The second pre-driver stage 16 includes an inverter 32 having its input connected also to receive the input drive signal $DSO_i$ and its output connected to the gate of the drive transistor 20. As is conventional, each of the CMOS inverters 30, 32 is formed of a P-channel MOS transistor and an N-channel MOS transistor whose gates are connected together to form its input and whose drains are connected together to form its output. The sources of the P-channel transistors are coupled to the positive voltage VDD, and the sources of the N-channel transistors are coupled to the ground potential VSS.

In order to control the drive current applied to the gate of the drive transistor 20 during a high-to-low transition, a source pull-down resistor $R_{Di}$ is connected between the positive voltage VDD and the source of the P-channel transistor in the inverter 32. When the output signal $OUT_i$ is switched from high to low in response to the drive signal $DSO_i$ causing the drive transistor 20 to turn on, a current I is quickly discharging from the capacitive load CL through the parasitic inductance L3, drive transistor 20, and parasitic inductance L2 to the ground potential VSS. The instantaneous voltage induced on the source (node VL2) of the drive transistor 20 will be equal to L2×dI/dt causing the ground bounce noise. The source resistor $R_{Di}$ will reduce the drive current to the gate of the drive transistor 20 and thus slows down its turn-on time, thereby reducing the drive current and the ground bounce noise. Similarly, a source pull-up resistor $R_{Ui}$ is connected between the ground potential VSS and the source of the N-channel transistor in the inverter 30 so as to control the drive current applied to the gate of the drive transistor 18 during a low-to-high transition.

However, this approach suffers from the disadvantage of requiring the use of an increased number of circuit components (e.g., a large number of resistors $R_{Ui}$, $R_{Di}$) which occupies a large amount of chip area. A second technique of the prior art to solve the power/ground bounce problem is shown in FIG. 2. The second technique is quite similar to the first one and utilizes an output buffer circuit 10b having constant current sources. As can be seen, the source resistor $R_{Ui}$ is replaced by a first constant current source $I_{Ui}$ and the source resistor $R_{Di}$ is replaced by a second constant current source $I_{Di}$. Nevertheless, it should be apparent that this second technique still suffers from all of the same drawbacks as the first technique.

The output buffer circuits of the present invention represents a significant improvement over the abovedescribed prior art buffer circuits so as to reduce power/ground bounce noise when multiple outputs thereof are being simultaneously switched. This is achieved by the provision of a shared pull-up resistor connected between a first pre-driver stage inverter and the ground potential and a shared pull-down resistor connected between a second pre-driver stage inverter and the power supply potential.

SUMMARY OF THE INVENTION

Accordingly, it is a general object of the present invention to provide an output noise control circuit having output buffer circuits with significantly reduced power/ground bounce noise which is relatively simple and economical to manufacture and assemble, but yet overcomes the disadvantages of the prior art output buffer circuits.

It is an object of the present invention to provide an output noise control circuit having output buffer circuits which have a significant reduction in power or ground bounce noise when multiple outputs thereof are being simultaneously switched.

It is another object of the present invention to provide an output noise control circuit with a plurality of output buffer circuits which is formed with a reduced number of circuit components than the traditional output buffer circuits currently available.

It is still another object of the present invention to provide an output noise control circuit with a plurality of output buffer circuits in which each has a first pre-driver stage with a shared source pull-up resistor and a second pre-drive stage with a shared source pull-down resistor.

In accordance with these aims and objectives, the present invention is concerned with the provision of an output noise control circuit with significantly reduced power/ground bounce characteristics when multiple outputs thereof are being simultaneously switched. The output noise control circuit includes a plurality of output buffers in which each is formed of an output driver stage, a first pre-driver stage, and a second pre-driver stage. Each of the output driver stages includes a pull-up drive transistor and a pull-down drive transistor.

The pull-up drive transistor has one of its main electrodes connected to a power supply potential node, its other one of its main electrodes connected to an output node, and its gate electrode connected to receive a first control signal for generating a low-to-high transition at the output node. The pull-down drive transistor has one of its main electrodes connected to the output node, its other one of its main electrodes connected to a ground potential node, and its gate connected to receive a second control signal for generating a high-to-low transition at the output node.

Each of the first pre-driver stages includes a first inverter having its input connected to receive a corresponding one of input drive signals and its output connected to the gate electrode of the pull-up drive transistor. A shared pull-up resistor has its one end coupled to each of the first pre-driver stage inverters and its other end connected to the ground potential node. Each of the second pre-driver stages includes a second inverter having its input connected to receive the corresponding one of the input drive signals and its output connected to the gate electrode of the pull-down drive transistor. A shared pull-down resistor has its one end coupled to each of the second pre-driver stage inverters and its other end connected to the power supply potential node.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

Figure 3:
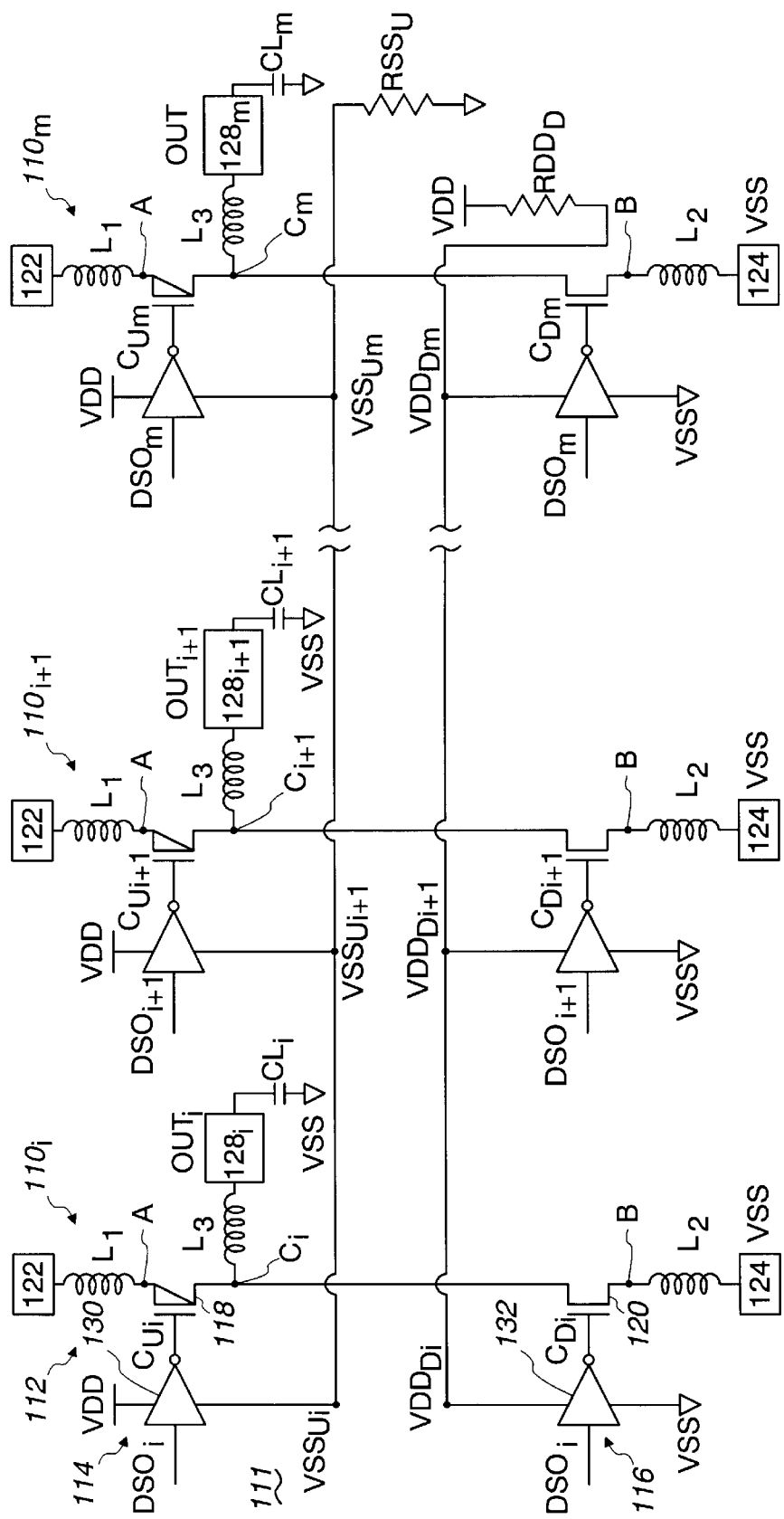
FIG. 3 is a schematic circuit diagram of an output noise control circuit, constructed in accordance with the principles of the present invention.

Referring now in detail to the drawings, there is illustrated in FIG. 3 a schematic circuit diagram of an output noise control circuit with significantly reduced power/ground bounce characteristics when multiple outputs thereof are being simultaneously switched, constructed in accordance with the principles of the present invention. The output noise control circuit is comprised of a plurality of output buffer circuits $110_i$–$110_m$ which are formed as a part of a semiconductor integrated circuit chip 111. Each of the plurality of buffer circuits $110_i$–$110_m$ consists of an output driver stage 112, a first pre-driver stage 114 and a second pre-driver stage 116. Each of the output driver stages 112 is formed of a P-channel MOS pull-up drive transistor 118 and an N-channel MOS pull-down drive transistor 120 coupled in series between respective first and second power supply pads 122, 124.

The first power supply pad 122 may be supplied with a positive voltage potential or voltage VDD which is typically at +5.0 volts or lower and is coupled to an internal power supply potential node A via a lead line having a package inductance L1. The source of the drive transistor 118 is also connected to the node A. The second power supply 124 may be supplied with a ground potential VSS which is typically at 0 volts and is coupled to an internal ground potential node B via a lead line having a parasitic inductance L2. The source of the drive transistor 120 is also connected to the node B.

The drains of the transistors 118 and 120 are connected together and are further joined to an internal output node $C_i$ which is coupled to an output pad $128_i$ via a lead line having a package inductance L3. An output signal $OUT_i$ is provided at the output pad $128_i$ of the first output buffer circuit 110$i$ and is used to drive a capacitive load $CL_i$ connected between the pad $128_i$ and the ground potential VSS. An output signal $OUT_{i+1}$ is provided at the output pad $128_{i+1}$ of the second output buffer circuit $110_{i+1}$ and is used to drive a capacitive load $CL_{i+1}$ and so on. An output signal $OUT_m$ is provided at the output pad $128_m$ of the last output buffer circuit $110_m$ and is used to drive a capacitive load $CL_m$.

Figure 5:
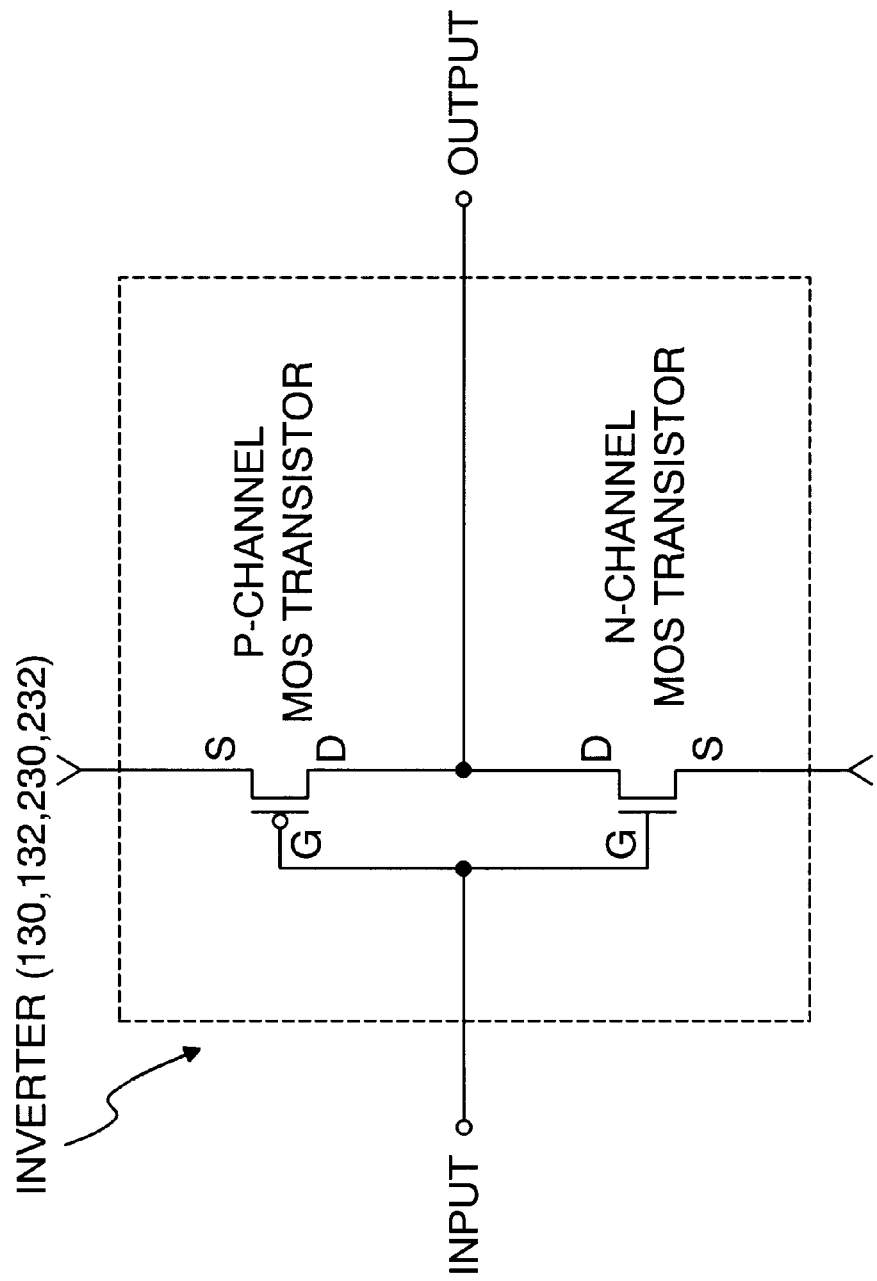
FIG. 5 is a schematic circuit diagram of a CMOS inverter for use in the inverters 130, 132 of FIG. 3 and in the inverters 230, 232 of FIG. 4.

Each of the first pre-driver stages 114 includes an inverter 130 having its input connected to receive a corresponding one of input drive signals $DSO_i$–$DSO_m$ and its output connected to the gates of the associated drive transistor 118. Each of the second pre-driver stages 116 includes an inverter 132 having its input also connected to receive the corresponding one of the input drive signals $DSO_i$–$DSO_m$ and its output connected to the gate of the associated drive transistor 120. Each of the CMOS inverters 130, 132 is formed of a P-channel MOS transistor and an N-channel MOS transistor whose gates are connected together to form its input and whose drains are connected together to form its output, as shown FIG. 5.

The sources of the P-channel transistors in the inverter 130 are connected to the positive voltage VDD, and the sources of the N-channel transistors in the inverter 132 are connected to the ground potential VSS. However, unlike the prior art of FIG. 1, the sources of the N-channel transistors in the inverter 130 is connected to a respective one of internal nodes $VSS_{Ui}$–$VSS_{Um}$ and the sources of the P-channel transistors in the inverter 132 is connected to a respective one of internal nodes $VDD_{Di}$–$VDD_{Dm}$. Further, a single shared pull-up resistor $RSS_U$ is used to replace all of the individual source resistors $R_{Ui}$ (one for each buffer circuit) of FIG. 1, and a single shared pull-down resistor $RDD_D$ is used to replace all of the individual resistors $R_{Di}$ of FIG. 1.

In particular, one end of the shared pull-up resistor $RSS_U$ is connected to the internal nodes $VSS_{Ui}$–$VSS_{Um}$ and the other end thereof is connected to the ground potential VSS.

One end of the shared pull-down resistors $RDD_D$ is connected to the internal nodes $VDD_{Di}$–$VDD_{Dm}$ and the other end thereof is connected to the power supply voltage VDD. In this manner, the number of circuit components (e.g., resistors) have been greatly reduced and thus occupy less chip area than required in the prior art buffer circuits.

Since the worst state condition (noisiest) is when all of the output signals $OUT_i$–$OUT_m$ are switched at the same time, the values of the resistors $RSS_U=R_{TU}$ and $RDD_D=R_{TD}$ are selected so that the $R_{TU}$, $C_{TU}$ time constant is slow enough to produce the allowable noise or voltage fluctuation (L2× dI/dt). If the parasitic capacitances on the corresponding gates of the pull-up drive transistors 118 are designated by $C_{Ui}$–$C_{um}$, then the total capacitance $C_{TU}$ during a low-to-high transition on a switched output is equal to $$\sum_{i=0}^{m} C_{Ui},$$

where m is the number of multiple outputs being switched at the same time. Similarly, if the parasitic capacitances on the corresponding gates of the pull-down drive transistors 120 are designed by $C_{Di}$–$C_{Dm}$, then the total capacitance $C_{TD}$ during a high-to-low transition on a switched output is equal to $$\sum_{i=0}^{m} C_{Di},$$

where m is the number of multiple outputs being switched at the same time. Therefore, the $R_{TU} C_{TU}$ or $R_{TD} C_{TD}$ delay ($RSS_U C_{TU}$ or $RDD_D C_{TD}$) is dependent upon the number of multiple outputs being simultaneously switched.

Figure 2:
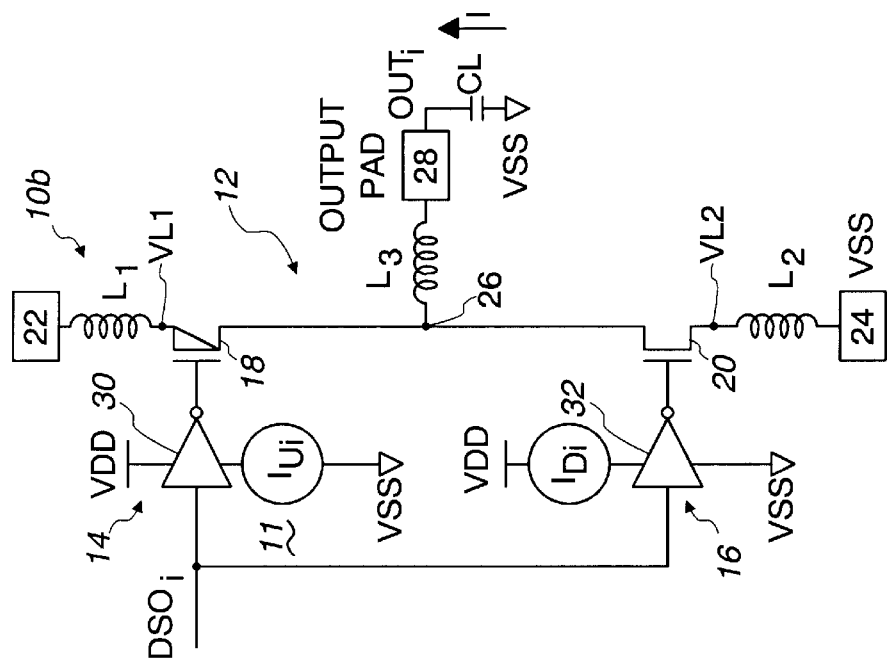
FIG. 2 is a schematic circuit diagram of another prior art output buffer circuit, similar to FIG. 1 but utilizing first and second constant current sources instead of the pull-up and pull-down resistors.
Figure 1:
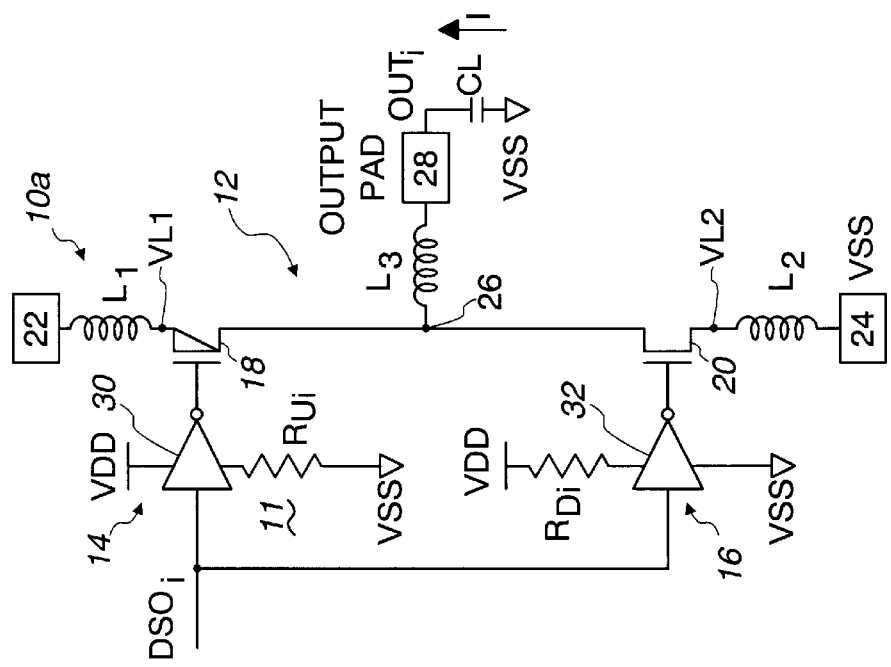
FIG. 1 is a simplified schematic circuit diagram of a prior art output buffer circuit for one bit only utilizing an individual source pull-up resistor and an individual source pull-down resistor.

In order to significantly reduce the ground bounce when the multiple internal output nodes C are making a high-to-low transition at the same time, the value of the resistor $RDD_D$ could be made to be $1/m \times R_{Ui}$ if the noise is to be controlled as in the prior art of FIG. 1. For example, for a memory device having eight bits, the value of $RDD_D$ is made to be ⅛ of $R_{Ui}$ of FIG. 1. If $R_{Ui}$ is assumed to be 1 K ohms, then $RDD_D$ of FIG. 3 is selected to have a value of 125 ohms. Thus, when all of the outputs are being switched at the same time, there would be the same amount of noise in the output buffer circuits of FIG. 3 as in FIG. 1. However, when less than all of the outputs are being switched at the same time, there would be smaller proportional amounts of noise in FIG. 3 for each unswitched output.

Figure 4:
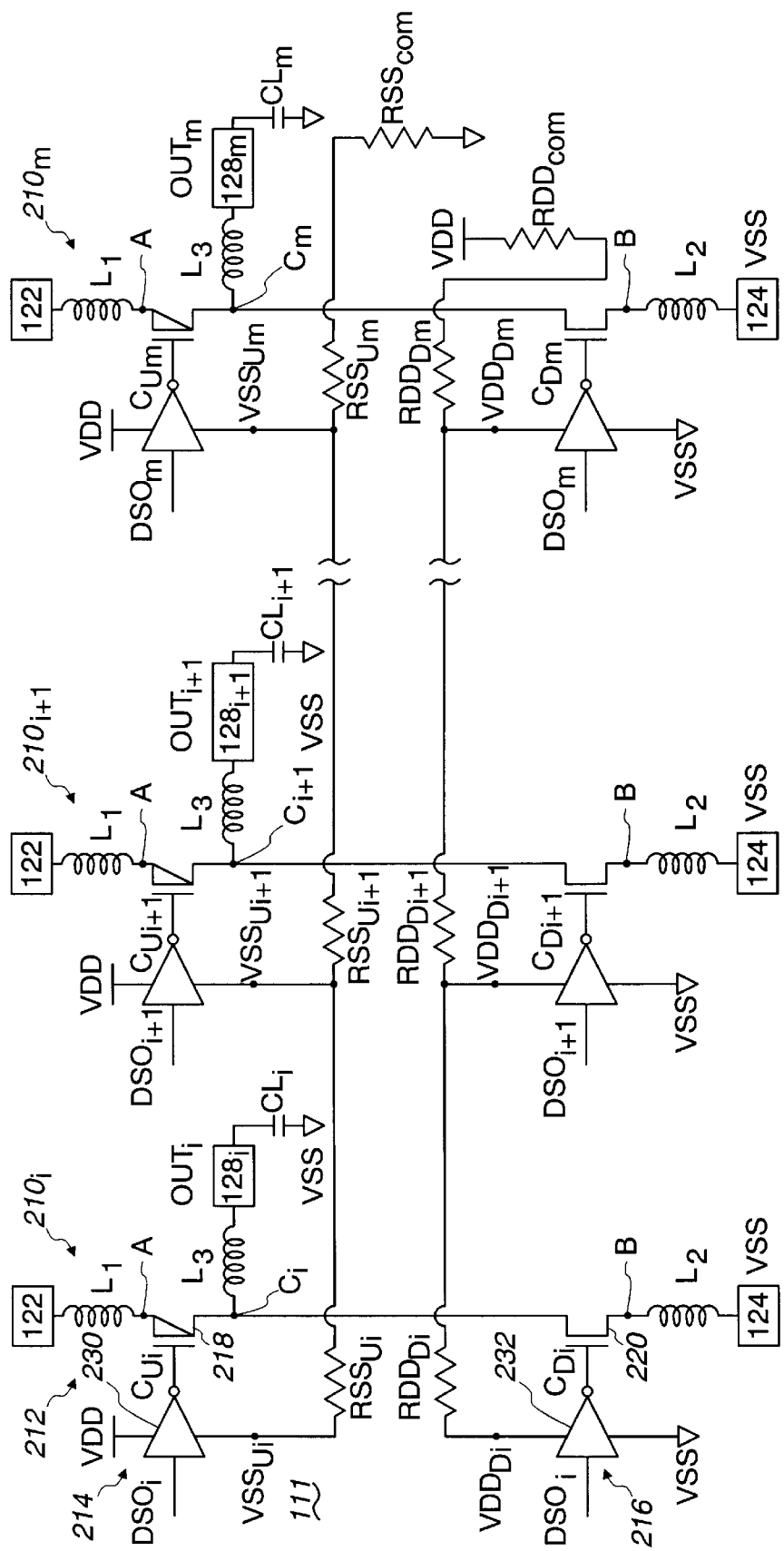
FIG. 4 is a schematic circuit diagram of a second embodiment of an output noise control circuit in accordance with the present invention.

In FIG. 4, there is shown a schematic circuit diagram of a second embodiment of an output noise control circuit comprising a plurality of output buffer circuits $210_i$–$210_m$ in accordance with the present invention. The output buffer circuits of FIG. 4 are quite similar to the buffer circuits of FIG. 3, except that additional individual pull-up source resistors $RSS_{Ui}$–$RSS_{Um}$ are connected to the respective first pre-driver stages 214 and additional individual pull-down source resistors $RDD_{Di}$–$RDD_{Dm}$ are connected to the respective second pre-driver stages 216.

In particular, the source of the N-channel transistor in the inverters 230 is connected to a respective one of the internal nodes $VSS_{Ui}$–$VSS_{Um}$. A plurality of individual pull-up source resistors $RSS_{Ui}$–$RSS_{Um}$ are connected together in a series chain between a single shared pull-up source resistor $RSS_{COM}$ and the internal node $VSS_{Ui}$. Each of the pull-up source resistors $RSS_{Ui}$–$RSS_{Um-1}$ are connected between adjacent internal nodes. For example, the resistor $RSS_{Ui}$ is connected between the adjacent internal nodes $VSS_{Ui}$ and $VSS_{Ui-1}$. The resistor $RSS_{Ui+1}$ is connected between the adjacent internal nodes $VSS_{Ui+1}$ and $VSS_{Ui+2}$, and so on. The last resistor $RSS_{Um}$ is connected between the internal node $VSS_{Um}$ and one end of the single shared pull-up source resistor $RSS_{COM}$. The other end of the resistor $RSS_{COM}$ is connected to the ground potential VSS.

Similarly, the source of the P-channel transistors in the inverters 232 is connected to a respective one of the internal nodes $VDD_{Di}$–$VDD_{Dm}$. A plurality of individual pull-down source resistors $RDD_{Di}$–$RDD_{Dm}$ are connected together in a series chain between a single shared pull-down source resistor $RDD_{COM}$ and the internal node $VDD_{Di}$. Each of the pull-down source resistors $RDD_{Di}$–$RDD_{Dm-1}$ are connected between adjacent internal nodes. For example, the resistor $RDD_{Di}$ is connected between the adjacent internal nodes $RDD_{Di}$ and $RDD_{Di+1}$. The resistor $RDD_{Di+1}$ is connected between the adjacent internal nodes $VDD_{Di+1}$ and $VDD_{Di+2}$, and so on. The last resistor $RDD_{Dm}$ is connected between the internal node $VDD_{Dm}$ and one end of the single pull-down source resistor $RDD_{COM}$. The other end of the resistor $RDD_{COM}$ is connected to the common power supply potential VDD.

The advantage obtained from the individual source resistors $RSS_{Ui}$–$RSS_{Um}$ or $RDD_{Di}$–$RDD_{Dm}$ on the respective first or second pre-driver stages is that the current flowing through the plurality of individual source resistors will create a voltage gradient which self-regulates the total peak current supplied to the respective first or second pre-driver stages. Thus, a speed gradient can be achieved through the distributed multiple outputs. In other words, dependent upon the location or distance of an individual output away from the common power supply voltage VDD or ground potential VSS, the individual output can be made to switch at different times. Therefore, the peak noise is spread out for the individual outputs, thereby reducing the total power or ground bounce noise at a given time.

From the foregoing detailed description, it can thus be seen that the present invention provides an output noise control circuit with significantly reduced power/ground bounce characteristics when multiple outputs are being simultaneously switched. The output nosie control circuit of the present invention includes a plurality of output buffers each being formed of an output driver stage, a first pre-driver stage, and a second pre-driver stage. Each of the output driver stages includes a pull-up drive transistor and a pull-down drive transistor. A shared pull-up resistor has its one end coupled to each of the first pre-driver stages and its other end connected to a ground potential node. A shared pull-down resistor has its one end coupled to each of the second pre-driver stages and its other end connected to the power supply node.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. An output noise control circuit with significantly reduced power/ground bounce characteristics when multiple outputs thereof are being simultaneously switched, said control circuit comprising in combination:

a plurality of output buffers, each being formed of an output driver stage, a first pre-driver stage, and a second pre-driver stage;

each of said output driver stages including a pull-up drive transistor and a pull-down drive transistor;

said pull-up drive transistor having one of its main electrodes connected to a power supply potential node, its other one of its main electrodes connected to an output node, and its gate connected to receive a first control signal for generating a low-to-high transition at the output node;

said pull-down transistor having one of its main electrodes connected to the output node, its other one of its main electrodes connected to a ground potential node, and its gate connected to receive a second control signal for generating a high-to-low transition at the output node;

each said first pre-driver stage including a first inverter having its input connected to receive a corresponding one of input drive signals and its output connected to the gate electrode of said pull-up drive transistor;

a shared pull-up resistor having its one end coupled to each of said first pre-driver stage inverters and its other end connected to the ground potential node;

each said second pre-driver stage including a second inverter having its input connected to receive said corresponding one of the input drive signals and its output connected to the gate electrode of said pull-down drive transistor; and a shared pull-down resistor having its one end coupled to each of said second pre-driver stage inverters and its other end connected to the power supply potential node.

2. An output noise control circuit as claimed in claim 1, wherein said pull-up drive transistor is a P-channel MOS transistor.

3. An output noise control circuit as claimed in claim 2, wherein said pull-down drive transistor is an N-channel MOS transistor.

4. An output noise control circuit as claimed in claim 3, wherein said first inverter is a CMOS inverter formed of a P-channel MOS transistor and an N-channel MOS transistor whose gate electrodes are connected together to form its input and whose drain electrodes are connected together to form its output.

5. An output noise control circuit as claimed in claim 4, wherein said second inverter is a CMOS inverter formed of a P-channel MOS transistor and an N-channel MOS transistor whose gate electrodes are connected together to form its input and whose drain electrodes are connected together to form its output.

6. An output noise control circuit as claimed in claim 5, wherein one end of said shared pull-up resistor is connected to the source electrode of the N-channel MOS transistor of said first inverter of each said first pre-driver stages.

7. An output noise control circuit as claimed in claim 6, wherein the one end of said shared pull-down resistor is connected to the source electrode of the P-channel MOS transistor of said second inverter of each said second pre-driver stages.

8. An output noise control circuit as claimed in claim 5, wherein one end of said shared pull-up resistor is connected via at least one of a plurality of individual pull-up source resistors joined together in a series chain to the source electrode of the N-channel MOS transistor of said first inverter of each said first pre-driver stages.

9. An output noise control circuit as claimed in claim 8, wherein the one end of said shared pull-down resistor is connected via at least one of a plurality of individual pull-down source resistors joined together in a series chain to the source electrode of the P-channel MOS transistor of said second inverter of each said second pre-driver stages.

10. An output noise control circuit with significantly reduced power/ground bounce characteristics when multiple outputs thereof are being simultaneously switched, said control circuit comprising in combination:
a plurality of output buffers, each being formed of output driver stage means, first pre-driver stage means, and second pre-driver stage means;
each of said output driver stage means including pull-up drive transistor means and pull-down drive transistor means;
said pull-up drive transistor means being responsive to a first control signal for generating a low-to-high transition at an output node;
said pull-down drive transistor means being responsive to a second control signal for generating a high-to-low transition at the output node;
each of said first pre-driver stage means includes first inverter means having its input connected to receive a corresponding one of input drive signals and its output connected to said pull-up drive transistor means;
a shared pull-up resistor having its one end coupled to each of said first pre-driver stage inverter means and its other end connected to a ground potential node;
each of said second pre-driver stage means including second inverter means having its input connected to receive said corresponding one of the input drive signals and its output connected to said pull-down drive transistor means; and
a shared pull-down resistor having its one end coupled to each of said second pre-driver stage inverter means and its other end connected to a power supply potential node.

11. An output noise control circuit as claimed in claim 10, wherein said pull-up drive transistor means is a P-channel MOS transistor.

12. An output noise control circuit as claimed in claim 11, wherein said pull-down drive transistor means is an N-channel MOS transistor.

13. An output noise control circuit as claimed in claim 12, wherein said first inverter means is a first CMOS inverter formed of a P-channel MOS transistor and an N-channel MOS transistor whose gate electrodes are connected together to form its input and whose drain electrodes are connected together to form its output.

14. An output noise control circuit as claimed in claim 13, wherein said second inverter means is a second CMOS inverter formed of a P-channel MOS transistor and an N-channel MOS transistor whose gate electrodes are connected together to form its input and whose drain electrodes are connected together to form its output.

15. An output noise control circuit as claimed in claim 14, wherein one end of said shared pull-up resistor is connected to the source electrode of the N-channel MOS transistor of said first inverter means of each first pre-driver stage means.

16. An output noise control circuit as claimed in claim 15, wherein the one end of said shared pull-down resistor is connected to the source electrode of the P-channel MOS transistor of said second inverter means of each said second pre-driver stage means.

17. An output noise control circuit as claimed in claim 14, wherein one end of said shared pull-up resistor is connected via at least one of a plurality of individual pull-up source resistors joined together in a series chain to the source electrode of the N-channel MOS transistor of said first inverter means of each first pre-driver stage means.

18. An output noise control circuit as claimed in claim 17, wherein the one end of said shared pull-down resistor is connected via at least one of a plurality of individual pull-down source resistors joined together in a series chain to the source electrode of the P-channel MOS transistor of said second inverter means of each said second pre-driver stage means.

* * * * *